United States Patent [19]

Munch

[11] Patent Number: 5,697,149
[45] Date of Patent: Dec. 16, 1997

[54] METHOD OF COATING AN ELECTRONIC COMPONENT

[75] Inventor: Robert Munch, Chatteauneuf en Thymerais, France

[73] Assignee: Schlumberger Industries, Montrouge, France

[21] Appl. No.: 637,387

[22] Filed: Apr. 25, 1996

[30] Foreign Application Priority Data

May 5, 1995 [FR] France .................. 95 05503

[51] Int. Cl.⁶ ............... H05K 3/30; H01K 3/10; B05D 5/12
[52] U.S. Cl. ............... 29/841; 29/850; 427/58; 427/96; 437/211
[58] Field of Search ............... 29/840, 837, 841, 29/850; 427/96, 97, 58; 437/211, 217, 219

[56] References Cited

U.S. PATENT DOCUMENTS

| | | | |
|---|---|---|---|
| 4,674,175 | 6/1987 | Stampfli | 29/841 |
| 5,041,395 | 8/1991 | Steffen | 437/217 |
| 5,182,853 | 2/1993 | Kobayashi et al. | 29/841 |
| 5,336,931 | 8/1994 | Juskey et al. | 437/211 |

FOREIGN PATENT DOCUMENTS 2 670 930  6/1992  France .

OTHER PUBLICATIONS

Patent Abstracts of Japan, vol. 1, No. 167 (E–610), 19 May 1988, and JP-A-62 276839 (Hirachi Ltd.), 1 Dec. 1987.

*Primary Examiner*—P. W. Echols
*Attorney, Agent, or Firm*—Frishauf, Holtz, Goodman Langer & Chick, P.C.

[57] ABSTRACT

A technique of coating an electronic component with a resin. A semiconductor chip is placed on an insulating film carrying electric contacts to which the semiconductor chip is connected by connection wires passing through holes formed in the insulating film. The holes in the insulating film are placed around a zone for receiving the semiconductor chip, and the semiconductor chip is placed on the insulating film in such zone. The connection wires are connected between the semiconductor chip and the electric contacts, and a drop of resin is deposited on the semiconductor chip and on the connection wires. This drop forms an outline defined solely by the holes due to surface tension applied by the resin retained in the holes. This arrangement is applicable to electronic modules for memory cards.

5 Claims, 3 Drawing Sheets

METHOD OF COATING AN ELECTRONIC COMPONENT

The present invention relates to a method of coating an electronic component comprising at least one semiconductor chip disposed on an insulating film. The invention also relates to apparatus for implementing said method.

A particularly advantageous application of the invention lies in the field of electronic modules for memory cards, be they cards in which the semiconductor chip is a microprocessor as is the case for bank transactions and for mobile telephones, or cards in which the semiconductor chip is an EEPROM type memory as is the case for phone cards used in pay phones.

BACKGROUND OF THE INVENTION

A technique commonly used for making electronic modules for memory cards is to place a semiconductor chip on an insulating film, either directly on the surface of the film or else in a window previously cut out in the thickness of the insulating film. In either case, the film carries electric contacts to which the semiconductor chip is connected by connection wires passing through perforations formed in the insulating film. The electric contacts are designed to provide electrical connection with a device such as a card reader with which the semiconductor chip is to interchange information.

The assembly comprising the semiconductor chip and its connection wires constitutes an electronic component which it is essential to protect both chemically against external attack such as corrosion, and mechanically, in particular because the connection wires are extremely fragile.

In general, the protection desired for electronic components is obtained by coating or "potting" the semiconductor chip together with its connection wires by means of a liquid thermoserring resin.

Two coating methods are presently in use.

In a first known method, a drop of high viscosity resin is deposited on the component. Then, after the resin has polymerized, the hardened drop is machined down to give the final component the desired thickness dimension.

In a second known method, the resin is molded directly around the electronic component.

Nevertheless, both of those two coating techniques suffer from serious drawbacks.

The first technique requires two operations, i.e. coating proper and then machining to size. In addition, the use of a high viscosity resin to prevent the resin from spreading requires complex deposition equipment to be used, particularly for large chips such as microprocessors, with such equipment being movable along three axes, thereby severely reducing throughput.

The second technique which comprises molding is expensive to implement, since it is necessary to manipulate molds, presses, etc.

OBJECTS AND SUMMARY OF THE INVENTION

An object of the present invention is to provide an improved technique of coating an electronic component comprising at least one semiconductor chip placed on an insulating film carrying electric contacts to which said semiconductor chip is connected by connection wires passing through holes formed in said insulating film. The technique makes it possible in a single coating operation to obtain both good protection for the component and the desired thickness dimension without resorting to any machining or molding.

One aspect of the present invention for achieving this and other objectives is directed to a method that comprises the following steps:

making said holes in the insulating film around a zone for receiving the semiconductor chip;

placing the semiconductor chip on the insulating film in said zone;

connecting said connection wires between the semiconductor chip and the electric contacts; and depositing a drop of resin on the semiconductor chip and on the connection wires, said drop presenting an outline defined solely by the holes.

Thus, the invention is based on using the effect of surface tension at the holes formed through the insulating film to prevent the drop of resin from spreading. The resin can thus be of much lower viscosity, which makes it easier to handle and also makes it possible to obtain the desired thickness without a machining operation and without complex deposition equipment, with it sufficing merely to use accurately measured-out drops of resin to start with.

To this end, the invention also provides apparatus for implementing the coating method of the invention, which apparatus comprises:

a dispenser suitable for delivering volume calibrated drops of resin via a flexible feed hose; and a coating head connected to the dispenser by said flexible feed hose, and including a coating chamber suitable for receiving said drops of volume-calibrated resin, said coating chamber having an outline designed to cover said holes at least in part.

BRIEF DESCRIPTION OF THE DRAWINGS

FIG. 1b is a front view in section on line II—II of FIG. 1a.

FIG. 2b is a front view in section on line III—III of FIG. 2a.

DETAILED DESCRIPTION OF THE INVENTION

Figure 1B:
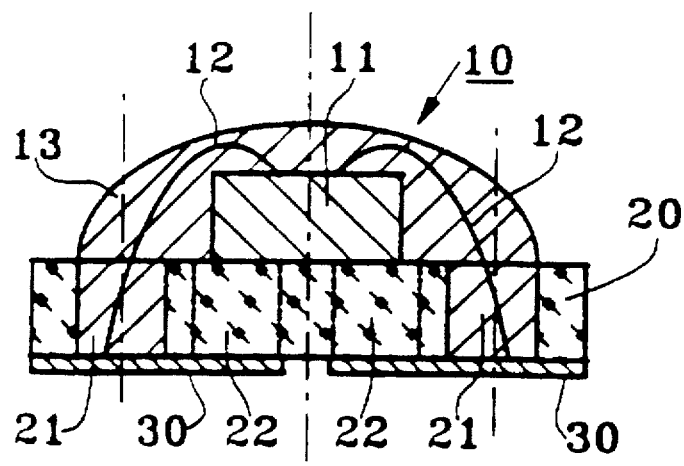
Figure 1A:
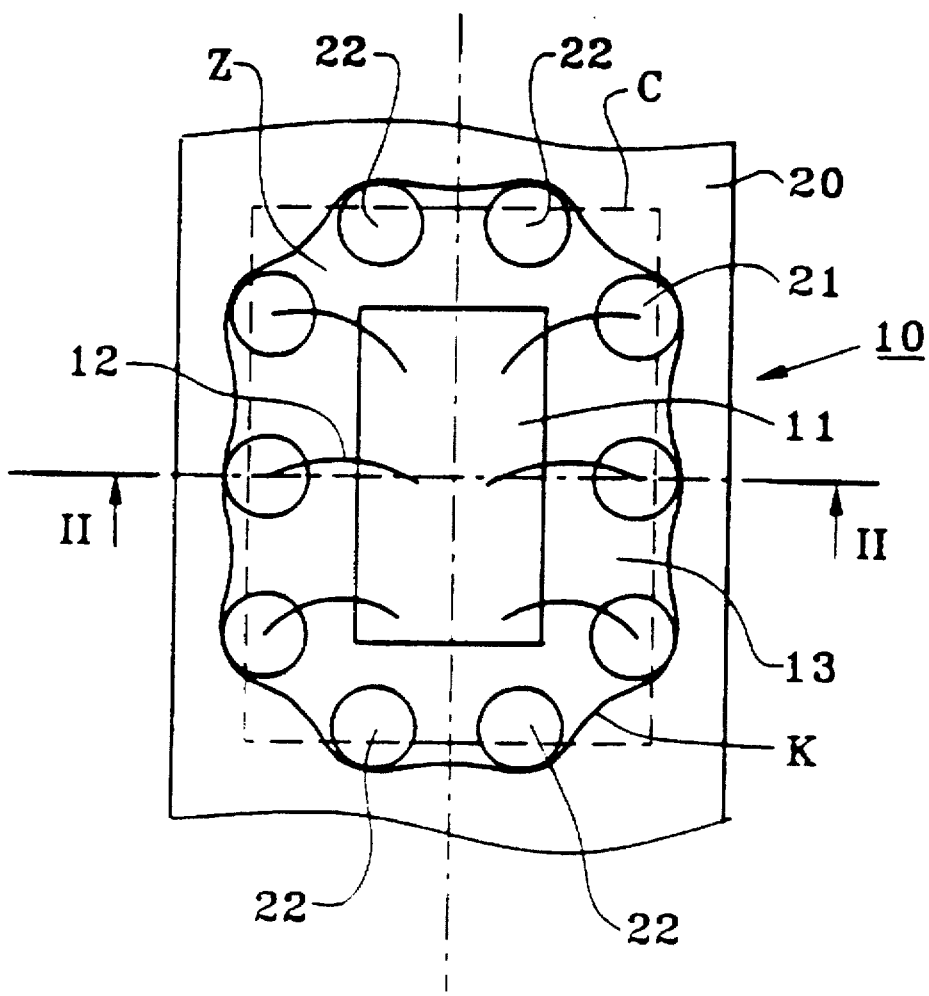
FIG. 1a is a plan view of a first electronic component coated in accordance with the invention.

FIGS. 1a and 1b show an electronic component 10 comprising a semiconductor chip 11, e.g. a microprocessor or an EEPROM memory, placed on one face of an insulating film 20 that is in the form of a strip made of a plastic material, for example.

As shown more clearly in FIG. 1b, the insulating film 20 carries electric contacts 30 on another of its faces, which contacts are designed to establish an electrical connection between a reader (not shown) and the semiconductor chip. For this purpose, the semiconductor chip 11 is connected to said electric contacts 30 by connection wires 12, e.g. gold wires. FIGS. 1a and 1b show clearly that said connection wires 12 pass through holes 21 formed in the insulating film 20.

To coat the electronic component 10 comprising the semiconductor chip 11 and its connection wires 12 in protective encapsulation, the following method is used.

Firstly, holes 21 and 22 are made through the insulating film 20 at the periphery of a zone Z that is to receive the semiconductor chip 11, with the holes referenced 21 being designed to pass the connection wires 12 of the component 10, and with the holes referenced 22 being additional holes through which connection wires 12 are not passed.

The semiconductor chip 11 is then affixed to the surface of the film 20 in the zone Z provided for this purpose, with the connection wires 12 subsequently being connected between the semiconductor chip 11 and the electric contacts 30 with which the insulating film 20 has previously been provided.

Finally, a drop 13 of liquid thermosetting resin of low viscosity is deposited on the electronic component 10 in such a manner as to coat the semiconductor chip 11 and the connection wires 12 completely and to fill the holes 21, 22. As can be seen in FIG. 1a, the outline K of the drop 13 covers said holes 21, 22 exactly. Spreading of the drop of resin 13 is restricted and even controlled by surface tension forces applied to the drop 13 at the holes 21, 22. It will be understood that under such conditions, if the volume of said drop 13 is accurately determined, it is possible to obtain a drop of reproducible shape, and in particular one that has a well-determined thickness dimension, without there being any need to adjust it by subsequent machining. The expression "low viscosity" is intended to describe the viscosity of the liquid thermosetting resin used in accordance with the invention as being lower than the viscosity of such resin which is used in the prior art discussed above.

Figure 3A:
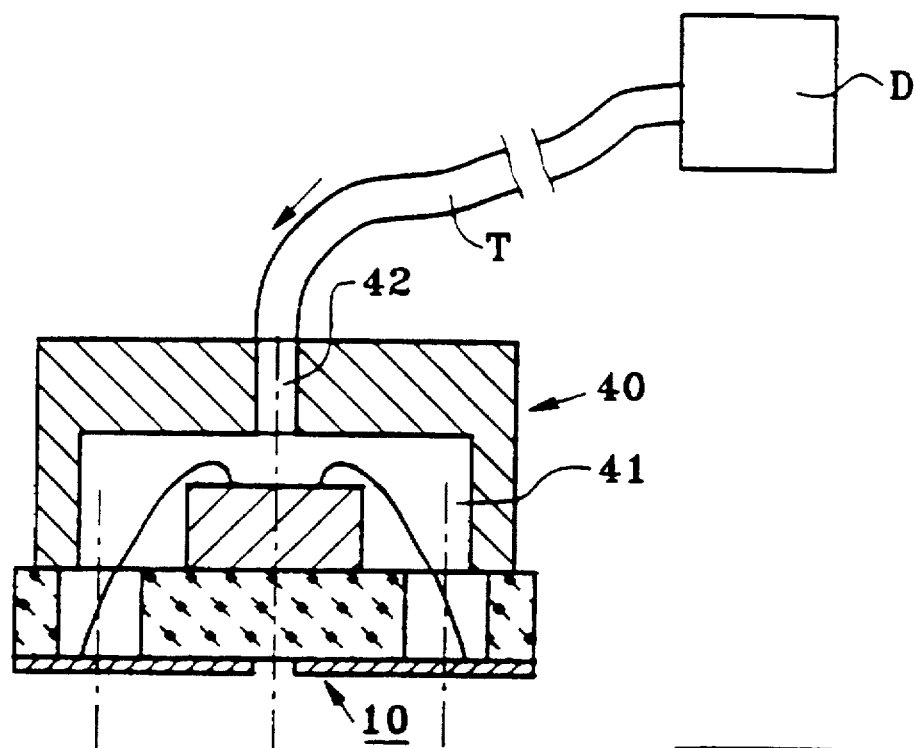
FIG. 3a is a front view in section showing the electronic component of FIG. 1b and a coating apparatus in accordance with the invention.
Figure 3B:
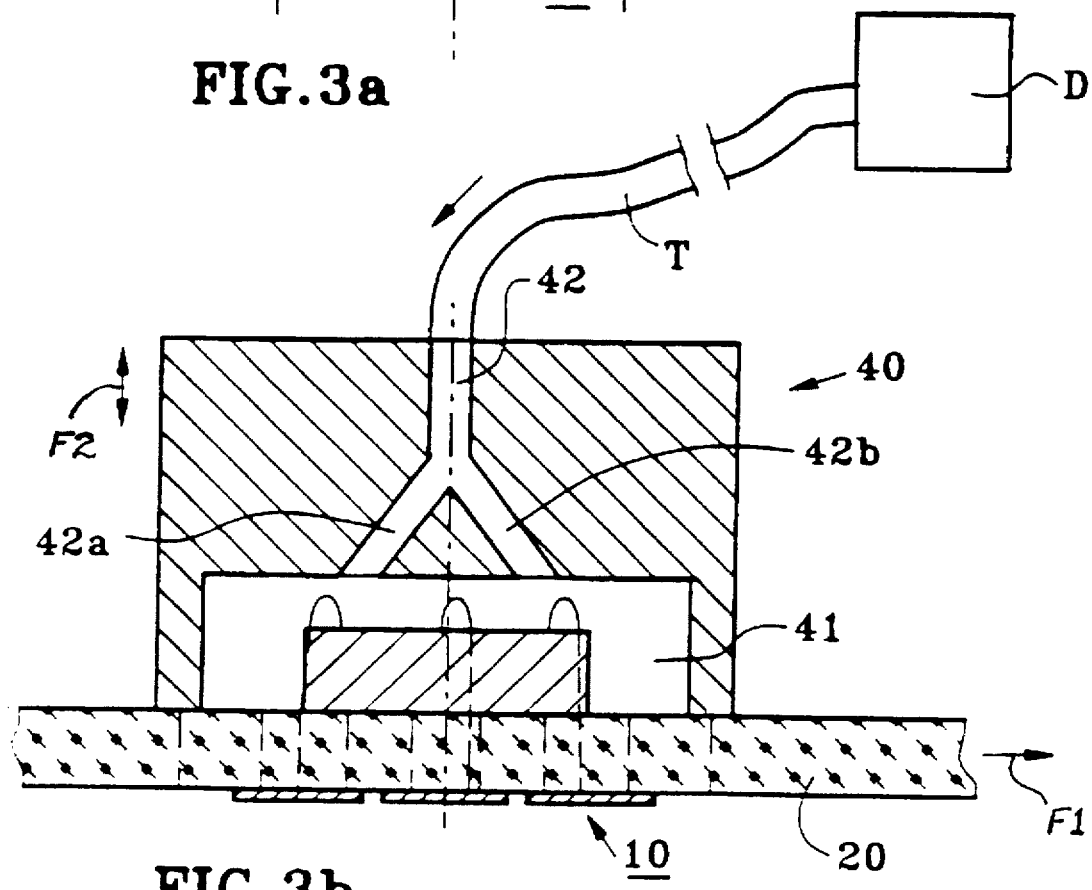
FIG. 3b is a side view in section showing the electronic component of FIG. 1b and a coating apparatus in accordance with another embodiment of the invention.

To perform the coating operation, the apparatus shown in FIGS. 3a and 3b is used, which apparatus comprises a dispenser D containing a liquid resin, e.g. epoxy or acrylic, that is of low viscosity. The dispenser D delivers volume-calibrated drops of resin via a flexible feed hose T. Dispenser D includes a container from which the resin flows under control of a valve designed to pass a specified amount which forms a drop of a desired volume. Such valves are well known in the art and, therefore, details thereof are not deemed necessary.

A coating head 40 is connected to the dispenser D via said flexible feed hose T and it includes a coating chamber 41 suitable for receiving the volume-calibrated drops of resin. Said chamber 41 preferably has a volume that is equal to that of the resin drops, although this is not essential. Also, in order to be able to fill the holes 21 and 22 without spreading, the outline C of the coating chamber must partially cover the holes 21 and 22, as shown in FIG. 1a, or in FIG. 2a where there can be seen the outline C' of the chamber 41 for another type of electronic component that is described below. The extent to which outlines C and C' cover the holes is variably selectable, with the critical requirement being that the effect of surface tension applied by the resin in the holes must be such as to prevent undue spreading of the resin.

In FIGS. 3a and 3b, it can be seen that the channel for injecting resin into the coating chamber 41 may have various possible shapes: it may constitute single straight portion 42 as shown in FIG. 3a or it may have a straight portion 42 that forks into two branches 42a and 42b in an upside-down Y-shape as shown in FIG. 3b.

This figure also shows that the above-described apparatus lends itself well to automating the operation of coating electronic components.

An arrow F1 in FIG. 3b represents the horizontal running direction of the strip of insulating film 20. Double ended arrow F2 in FIG. 3b represents a vertical motion of coating head 40. The coating head 40 is located at a fixed station on the running path of the strip of insulating film 20. Each time a component approaches the coating head, horizontal motion of the strip is stopped, the head 40 is lowered into position over the electronic component 10 and a drop of resin is injected into the coating chamber 41. After such injection has been completed, the coating head 40 is disengaged by raising it and the strip advances to present the following component to the coating head. Techniques for the control of the above-described motion of coating head 40 and insulating film 20, as well as the synchronization therebetween, are well known to one ordinarily skilled in the art. Therefore, details thereof are not deemed necessary.

Figure 2B:
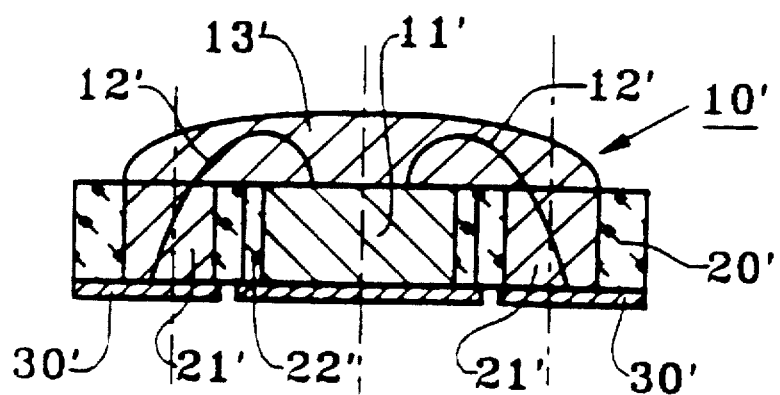
Figure 2A:
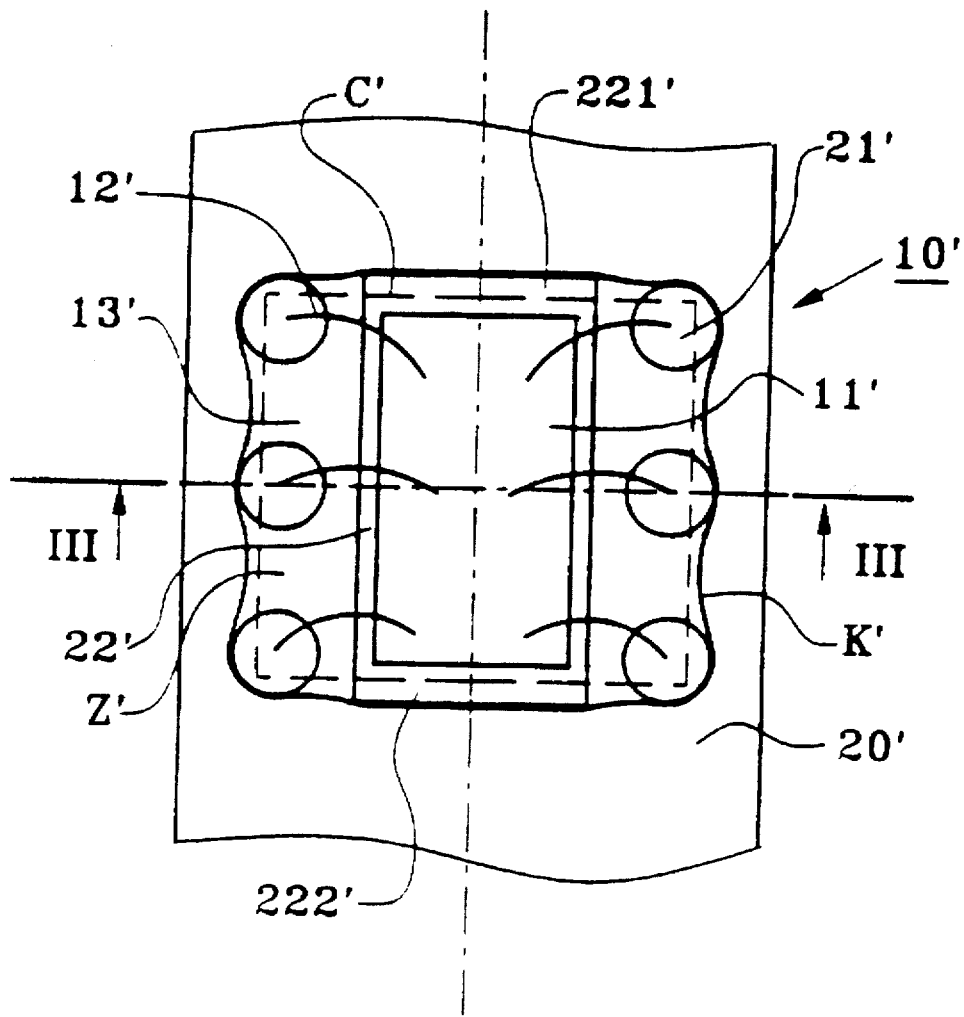
FIG. 2a is a plan view of a second electronic component coated in accordance with the invention.

In the embodiment shown in FIGS. 2a and 2b, the electronic component 10' comprises a semiconductor chip 11' disposed in a window 22' formed in the insulating film 20'.

The semiconductor chip 11' is connected to the electric contacts 30' by connection wires 12' passing through holes 21' formed around the zone Z' of the film 20' in which the window 22' is cut out. As can be seen in FIG. 2a, in this case the outline C' of the coating chamber partially covers both the holes 21' and two opposed sides 221', 222' of the window 22', with the outline K' of the drop 13' deposited in this way covering said holes 21' and the two sides 221' and 222'.

I claim:

1. A method of coating an electronic component comprising at least one semiconductor chip placed on one surface of an insulating film carrying electric contacts on an opposite surface thereof to which said semiconductor chip is connected by connection wires passing through holes formed in said insulating film between the two surfaces thereof, the method comprising the following steps:

making the holes in the insulating film peripherally around a zone adapted for receiving the semiconductor chip;

placing the semiconductor chip on the one surface of said insulating film and in said zone;

connecting the connection wires between the semiconductor chip and the electric contacts; and depositing a drop of resin on the semiconductor chip and on the connection wires to form an outline defined solely by the holes under control of surface tension forces applied by resin in the holes.

2. A coating method according to claim 1, wherein said resin is a liquid thermoseetting resin of low viscosity.

3. A coating method according to claim 1, wherein said semiconductor chip is placed on the one surface of the insulating film, and additional holes are made identical to said holes wherein the connection wires are not passed through said additional holes, and said additional holes are within said zone and are filled with said resin.

4. A coating method according to claim 1, wherein said semiconductor chip is placed in a window formed in the insulating film, and said holes are located outside said window.

5. A coating method according to claim 1, wherein said depositing step includes volume calibrating said drop of resin so that it fills the holes and covers the semiconductor chip and the wires with a coat shaped to have said outline defined solely by the holes.

* * * * *

UNITED STATES PATENT AND TRADEMARK OFFICE
CERTIFICATE OF CORRECTION

PATENT NO. : 5,697,149
DATED : December 16, 1997
INVENTOR(S) : MUNCH, Roger

It is certified that error appears in the above-identified patent and that said Letters Patent is hereby corrected as shown below:

Title page, Item [75] Inventor, "Robert" should be --Roger--.

Signed and Sealed this

Twenty-third Day of June, 1998

Attest:

BRUCE LEHMAN

*Attesting Officer*  *Commissioner of Patents and Trademarks*